United States Patent [19]

Lewis

[11] 3,714,589

[45] Jan. 30, 1973

[54] DIGITALLY CONTROLLED PHASE SHIFTER

[76] Inventor: Roger G. Lewis, 43 Thorncliffe Pk., Dr., Toronto, Ontario, Canada

[22] Filed: Dec. 1, 1971

[21] Appl. No.: 203,722

[52] U.S. Cl. ........................328/155, 328/48, 328/72
[51] Int. Cl. ..............................................H03b 3/04
[58] Field of Search ............................328/48, 72, 155

[56] References Cited

UNITED STATES PATENTS

| | | | |
|---|---|---|---|
| 3,271,688 | 9/1966 | Gschwind | 328/155 X |
| 3,337,814 | 8/1967 | Brase et al. | 328/155 X |
| 3,538,442 | 11/1970 | Arkell et al. | 328/48 X |
| 3,546,703 | 12/1970 | Kurth | 328/155 X |
| 3,550,015 | 12/1970 | Naubereit et al. | 328/48 |

*Primary Examiner*—John S. Heyman
*Attorney*—Robert J. Crawford et al.

[57] ABSTRACT

Disclosed is a digitally controlled phase shifter which utilizes a phase locked loop to provide a closed loop system for the determination of phase shift. The phase shift at the output is controlled in arbitrarily small increments by adjustment of the division ratio of a digitally controlled variable counter.

2 Claims, 2 Drawing Figures

DIGITALLY CONTROLLED PHASE SHIFTER

This application relates to phase shifters and more particularly relates to a digitally controlled phase shifter based on a phase locked loop principle.

In many applications it is desirable to provide a square wave signal shifted in time or phase by a precise, known, but variable amount from an input or reference square wave of the same frequency. Such signals are commonly produced by analog means, such as utilization of the transition of the input signal to trigger a monostable multivibrator, with the falling edge of the output signal of the multivibrator being used to synchronize an oscillator output. By varying the duration of the on time of the monostable multivibrator by suitable RC circuit means, the phase of the output signal can be varied. Such a system suffers from the disadvantage that the phase shift is only as accurate as the period of the monostable multivibrator, and this varies with the temperature and gain of the devices used to make the multivibrator. Therefore, resolution and accuracy of the output phase is limited.

This invention utilizes a phase locked loop to provide a closed loop system for the determination of phase shift. The output is controlled in arbitrarily small increments and the accuracy is determined by the digitally controlled division ratio of a counter circuit instead of an RC time constant.

It is therefore an object of the invention to produce a phase shifter which utilizes a digitally controlled phase locked loop to provide a closed loop system for the determination of phase shift.

The invention will be more clearly understood from the following detailed description of the invention when read in conjunction with the accompanying drawings wherein.

Figure 1:
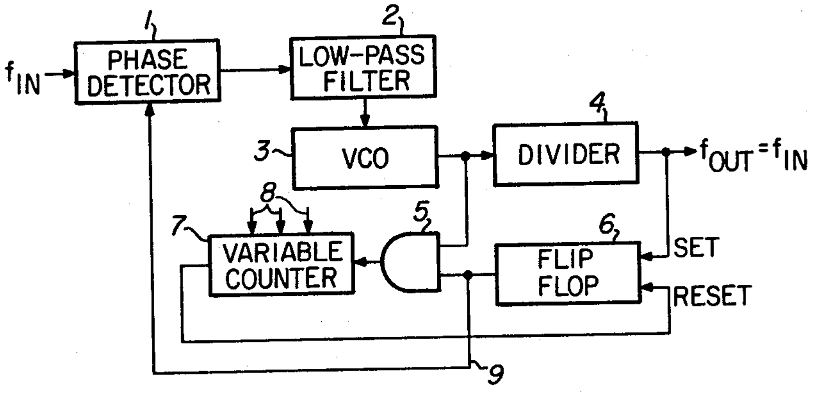
FIG. 1 is a schematic block diagram of the phase shift circuit.

Referring to FIG. 1 the input or reference signal is applied as one of two inputs to phase detector 1. The output of phase detector 1 is passed through the low pass filter 2 and applied to a voltage controlled oscillator 3. The frequency of the oscillator 3 is controlled by the level of the DC voltage from low pass filter 2. The oscillator output frequency is divided by fixed divider 4, the output of which is a symmetrical square wave which forms the desired output of the phase shifter. The output of the voltage controlled oscillator 3 is applied as one of the inputs to AND gate 5. A bistable device such as flip-flop 6 receives a set pulse from the output of divider 4. The output of the flip-flop 6 is the second input to AND gate 5. The output of the AND gate 5 actuates variable counter 7, and the output of counter 7 is applied as the reset pulse of flip-flop 6. The output of flip-flop 6 is also applied as the remaining input of the phase detector 1. The variable counter 6 is selectively controlled by digital control switches 8.

Figure 2:
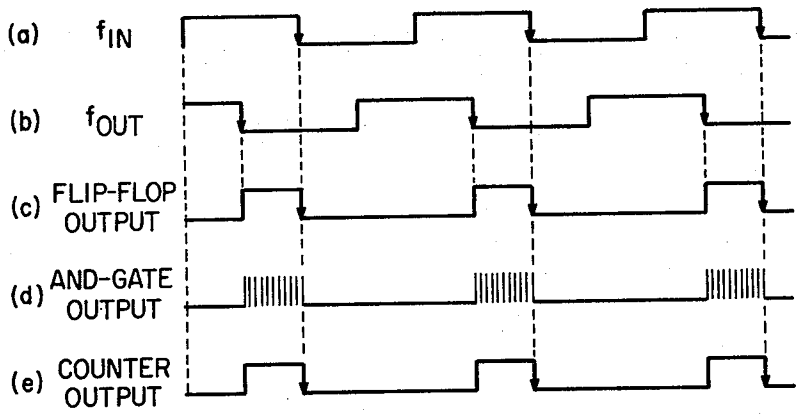
FIG. 2 illustrates the relation of the various wave forms at various circuit junctures in FIG. 1.

In operation, with reference to FIGS. 1 and 2, a square wave input or reference signal as shown at (a) in FIG. 2 is applied as the input or reference signal to phase detector 1. The output of the phase detector is filtered by the low pass filter 2 and applied to the voltage controlled oscillator 3, the frequency of which is controlled by the level of the DC voltage from the low pass filter to provide a signal of $Xf_{in}$. The output of the voltage controlled oscillator 3 is applied to AND gate 5 and fixed divider 4. The divider 4 divides by X to obtain the desired output frequency $f_{in}$. The falling edge of the output of divider 4 as shown at (*b*) is used to set flip-flop 6 to a logic "1" state as shown at (*c*) in FIG. 2. With inputs received from flip-flop 6, AND gate 5 opens and admits pulses of the oscillator 3 into the counter 7. The number of pulses counted by the counter 7 continues as shown at (*d*) until the count equals the preset number which has been set in the counter by control switches 8, producing the counter output as shown at (*e*) in FIG. 2. When the preset number is reached the output of the counter 7 changes state and applies a pulse to flip-flop 6 to reset the flip-flop to logic "0" thereby closing AND gate 5. As shown at 9 in FIG. 1 the output of the flip-flop 6 is also applied as the remaining input of phase detector 1. When the loop is closed in this manner the frequency of the voltage controlled oscillator will momentarily change and cause the falling edge of the output of the flip-flop 6 to be exactly coincident with the falling edge of the reference input. When this condition is reached the frequency of the variable controlled oscillator becomes constant and the loop is locked. As long as the falling edge of the output of flip-flop 6 remains coincident with the falling edge of the input signal, then the falling edge of the output wave form of the divider 4 will precede this event by exactly N periods of oscillator frequency, where N is the division ratio of the counter 7 as set by switches 8. Phase detector 1, which assures that the falling edge of the input signal is coincident with the output of the flip-flop 6, is a commercially available device well known in the art. One such phase detector is the MC–4344–E available from Motorola.

In one preferred embodiment, the reference signal is 10 kHz and the oscillator 3 runs at 3.6 MHz when the loop is locked. The fixed divider 4 divides the oscillator output by 360, thus providing a 10 kHz output. The variable counter 7 is equipped with digital control switches 8 to provide a range of one to 360 in steps of one so that the increments of phase shift at the output are exactly 1°. Obviously, if the division ratio of the variable counter is changed from N to 360– N, then the output phase will lag the input phase in accordance with the incremental setting of the variable counter.

What is claimed is:

1. A digitally controlled phase shifter comprising: a phase detector having as a first input a signal to be phase shifted; means connecting the output of said phase detector to the input of a voltage controlled oscillator; means connecting the output of said voltage controlled oscillator to the input of a divider; means connecting the output of said divider as the first of two inputs to a bistable device; means connecting the output of said flip-flop and the output of said variable controlled oscillator as the two inputs of an AND gate; means connecting the output of said AND gate to a variable counter; means connecting the output of said variable counter as the second input of said bistable device; and means for connecting the output of said bistable device as a second input to said phase detector.

2. The phase shifter of claim 1 wherein said means connecting the output of said phase detector to the input of a voltage controlled oscillator includes a low pass filter.

* * * * *